(12) United States Patent
McNeil et al.

(10) Patent No.: US 6,465,320 B1
(45) Date of Patent: Oct. 15, 2002

(54) ELECTRONIC COMPONENT AND METHOD OF MANUFACTURING

(75) Inventors: Andrew C. McNeil, Scottsdale, AZ (US); Daniel Koury, Jr., Mesa, AZ (US); Bishnu P. Gogoi, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 17 days.

(21) Appl. No.: 09/595,090

(22) Filed: Jun. 16, 2000

(51) Int. Cl.[7] .............................................. H01L 21/20
(52) U.S. Cl. ...................... 438/396; 438/396; 438/381; 438/399; 438/4; 438/17
(58) Field of Search .............................. 438/17, 393, 4, 438/396, 14, 399, 381; 257/306

(56) References Cited

U.S. PATENT DOCUMENTS

| | | | | |
|---|---|---|---|---|
| 4,785,669 A | * | 11/1988 | Benson et al. ................. 73/718 |
| 5,148,126 A | * | 9/1992 | Spencer ....................... 331/135 |
| 5,817,533 A | * | 10/1998 | Sen et al. ....................... 438/4 |
| 6,057,692 A | * | 5/2000 | Allmendinger et al. ..... 324/660 |
| 6,198,123 B1 | * | 3/2001 | Linder et al. ................ 257/306 |
| 6,291,847 B1 | * | 9/2001 | Ohyu et al. .................. 257/306 |

\* cited by examiner

*Primary Examiner*—David Nelms
*Assistant Examiner*—Thao P Le
(74) *Attorney, Agent, or Firm*—Charles W. Bethards; Mark J. Fink

(57) ABSTRACT

A method of manufacturing an electronic component includes forming first, second, and third capacitors (260, 270, 280) and electrically testing the first, second, and third capacitors to characterize an etch process for a sacrificial layer. Each of the first, second, and third capacitors has different amounts of first and second electrically insulative materials.

26 Claims, 4 Drawing Sheets

600

700

US 6,465,320 B1

ELECTRONIC COMPONENT AND METHOD OF MANUFACTURING

FIELD OF THE INVENTION

This invention relates, in general, to electronics, and more particularly, to electronic components and methods of manufacture.

BACKGROUND OF THE INVENTION

In the manufacturing of micro-machined structures, a sacrificial layer located underneath a patterned electrode must be removed. If the etch process used to remove the sacrificial layer is too short, an insufficient amount of the sacrificial layer is removed, and the overlying electrode is not released and is not movable. However, if the etch process used to remove the sacrificial layer is too long, other layers or features of the micro-machined structure are eroded.

One technique for evaluating the etch process for the sacrificial layer involves a manual, visual inspection using visible or infrared light. Another technique for evaluating the sacrificial layer etch process involves a manual, destructive test using a probe needle or adhesive tape to remove the released electrode. However, these techniques are costly and are difficult to automate. Furthermore, these manual techniques are not compatible with existing Statistical Process Control (SPC) methods.

Accordingly, a need exists for an electronic component and method of manufacturing having test structures capable of characterizing the etch process for the sacrificial layer. The measurement or evaluation of such test structures should be easily automated such that the characterization of the etch process for the sacrificial layer is compatible with existing SPC methods using electrical probe data.

BRIEF DESCRIPTION OF THE DRAWINGS

The invention will be better understood from a reading of the following detailed description, taken in conjunction with the accompanying drawing figures in which.

Figure 1:
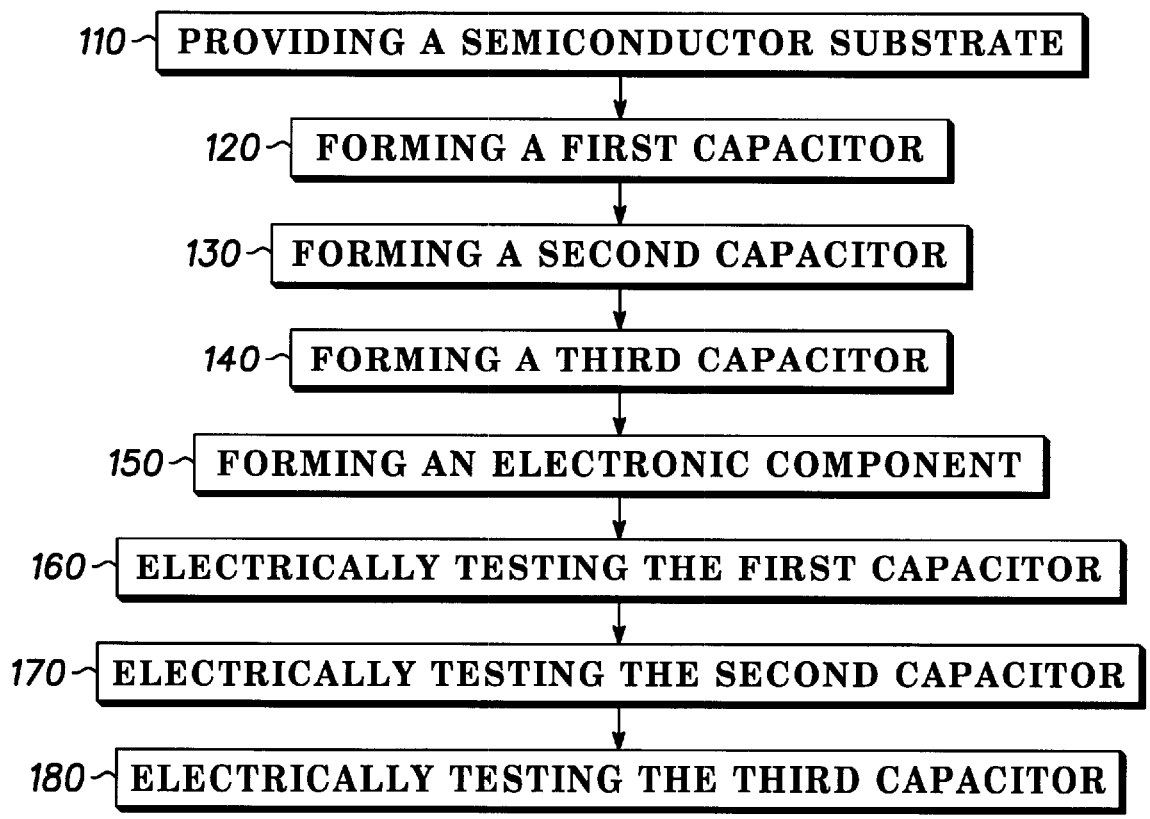
FIG. 1 illustrates a flow chart for a method of manufacturing an electronic component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements. For example, the electrical testing or bonding pads and the electrical interconnects coupled to the pads are also not illustrated in the drawing figures.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms left, right, front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

FIG. 1 illustrates a flow chart for a method 100 of manufacturing an electronic component. At a step 10 of method 100, a substrate is provided. In the preferred embodiment, the substrate is a semiconductor substrate. As an example, the semiconductor substrate can be comprised of a semiconductor epitaxial layer supported by a semiconductor support layer. The substrate can also be comprised of glass, plastic, or other rigid material.

At a step 120 of method 100, a first capacitor is formed. The first capacitor is supported by the semiconductor substrate and is comprised of a first electrically conductive region, a second electrically conductive region separated from the first electrically conductive region by a distance to form a first capacitive area having a size. The first capacitor also comprises a first amount or volume of a first electrically insulative material located directly between the first and second electrically conductive regions. In the preferred embodiment, the second electrically conductive region overlies the first electrically conductive region and the semiconductor substrate.

At a step 130 of method 100, a second capacitor is formed. The second capacitor is supported by the semiconductor substrate and is comprised of a third electrically conductive region and a fourth electrically conductive region separated from the third electrically conductive region by a distance to form a second capacitive area having a size. The distance separating the third and fourth electrically conductive regions of the second capacitor from each other is preferably the same as the distance separating the first and second electrically conductive regions of the first capacitor from each other. Furthermore, the size of the second capacitive area for the second capacitor is preferably the same as the size of the first capacitive area for the first capacitor. Also in the preferred embodiment, the fourth electrically conductive region overlies the third electrically conductive region and the semiconductor substrate.

The second capacitor is also comprised of a second amount or volume of the first electrically insulative material located directly between the third and fourth electrically conductive regions, and the second capacitor is further comprised of a third amount or volume of a second electrically insulative material located directly between the third and fourth electrically conductive regions. The second electrically insulative material of the second capacitor is preferably absent from between the first and second electrically conductive regions of the first capacitor. The second electrically insulative material preferably has a lower dielectric constant than the first electrically insulative material. Also in the preferred embodiment, the second amount of the first electrically insulative material in the second capacitor is less than the first amount of the first electrically insulative material in the first capacitor. Further in the preferred embodiment, the first electrically insulative material in the second capacitor is located between first portions of the third and fourth electrically conductive regions, and the second electrically insulative material in the second capacitor is located between second portions of the third and fourth electrically conductive regions that are different from the first portions of the third and fourth electrically conductive regions.

At a step 140 of method 100, a third capacitor is formed. In the preferred embodiment, steps 120, 130, and 140 are performed simultaneously with each other. The third capacitor is supported by the semiconductor substrate and is comprised of a fifth electrically conductive region and a sixth electrically conductive region separated from the fifth electrically conductive region by a distance to form a third capacitive area having a size. The distance separating the fifth and sixth electrically conductive regions of the third capacitor is preferably the same as the distance separating the first and second electrically conductive regions in the first capacitor and is also preferably the same as the distance separating the third and fourth electrically conductive regions in the second capacitor. Furthermore, the size of the third capacitive area in the third capacitor is preferably the same as the size of the second capacitive area in the second capacitor and is also preferably the same as the size of the first capacitive area in the first capacitor. Also in the preferred embodiment, the sixth electrically conductive region overlies the semiconductor substrate and also preferably overlies the fifth electrically conductive region.

The third capacitor additionally comprises a fourth amount or volume of the second electrically insulative material located directly between the fifth and sixth electrically conductive regions. The fourth amount of the second electrically insulative material in the third capacitor is preferably greater than the third amount of the second electrically insulative material in the second capacitor. The first electrically insulative material is preferably absent from between the fifth and sixth electrically conductive regions of the third capacitor.

At a step 150 of method 100, an electronic component is formed. In the preferred embodiment, step 150 is performed simultaneously with steps 120, 130, and 140. The electronic component is supported by the semiconductor substrate and comprises a fourth capacitor. This fourth capacitor can be the same size or can be a different size from the first, second, or third capacitors. However, the first, second, and third capacitors of steps 120, 130, and 140, respectively, are preferably formed in one of a plurality of scribe grids, while the electronic component of step 150 is preferably formed within a die delineated by the scribe grids.

At a step 160 of method 100, the first capacitor is electrically tested; at a step 170 of method 100, the second capacitor is electrically tested; and at a step 180 of method 100, the third capacitor is electrically tested. The sequence of steps 160, 170, and 180 can be altered or reversed. As explained hereinafter, the electrical testing of the first, second, and third capacitors characterizes or provides information on the processing of the electronic component. The electrical testing can be easily automated, can be performed during wafer probe, and is compatible with existing Statistical Process Control (SPC) methods. In the preferred embodiment, a second capacitance value measured from the second capacitor is preferably less than a first capacitance value measured from the first capacitor. Additionally, a third capacitance value measured from the third capacitor is preferably less than the second capacitance value measured from the second capacitor.

Figure 2:
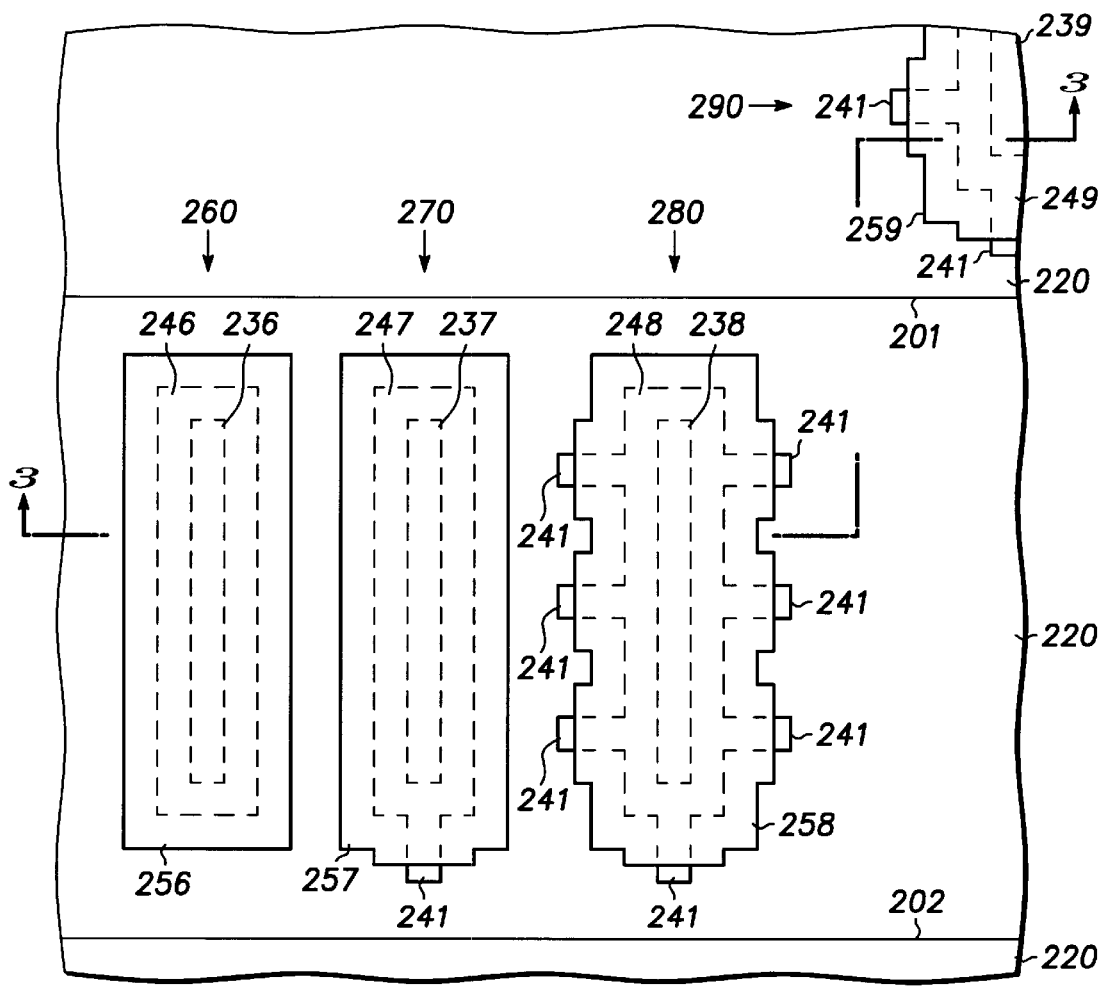
FIG. 2 illustrates a top view of a portion of an electronic component during the method of FIG. 1 in accordance with an embodiment of the invention.
Figure 3:
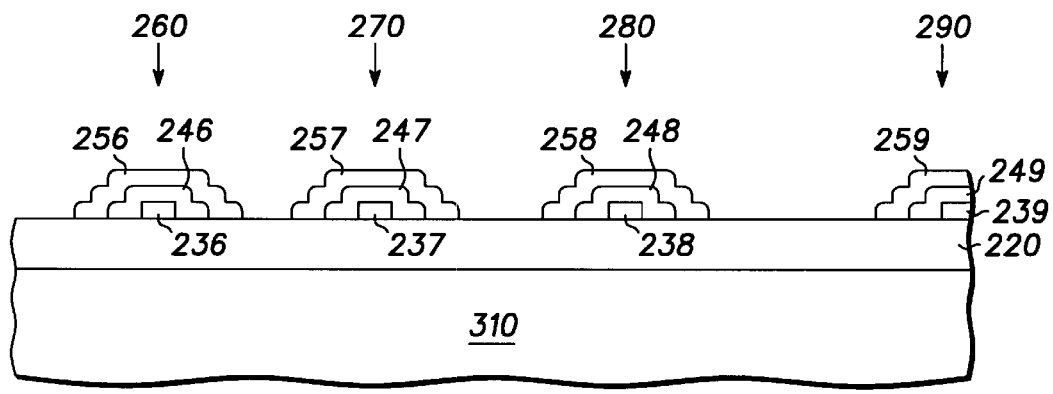
FIG. 3 illustrates a cross-sectional view of the portion of the electronic component of FIG. 2 taken along a section line 3—3.

FIG. 2 illustrates a top view of a portion of an electronic component 200 during method 100 of FIG. 1. Component 200 includes a capacitor 290 and a plurality of test structures. As an example, the test structures can include capacitors such as capacitors 260, 270, and 280. Other features of component 200 are not illustrated in FIG. 2. FIG. 3 illustrates a cross-sectional view of the portion of electronic component 200 and the test structures, taken along a section line 3—3 in FIG. 2. As illustrated in FIG. 3, capacitors 260, 270, and 280 are formed in a scribe grid defined by lines 201 and 202 in FIG. 2, while capacitor 290 is formed in a die defined at least partially by the scribe grid.

In the manufacturing of electronic component 200, an electrically insulative layer 220 is disposed over a semiconductor substrate 310 (FIG. 3). As an example, layer 220 can be comprised of a solid dielectric material such as silicon dioxide, phosphosilicate glass (PSG), tetra-ethyl-orthosilicon (TEOS), silicon nitride, an organic material, or any combination thereof.

Then, a first electrically conductive region 236, a third electrically conductive region 237, a fifth electrically conductive region 238, and an additional electrically conductive region 239 are formed over electrically insulative layer 220. Regions 236, 237, 238, and 239 can serve as bottom capacitive electrodes for capacitors 260, 270, 280, and 290, respectively. As an example of a simultaneous formation of regions 236, 237, 238, and 239, an electrically conductive layer can be deposited over electrically insulative layer 220. The electrically conductive layer can be comprised of, for example, doped polycrystalline silicon or a metal. Then, the electrically conductive layer can be patterned into regions 236, 237, 238, and 239. In an alternative embodiment, regions 236, 237, 238, and 239 can be formed in semiconductor substrate 310. Regions 236, 237, 238 and 239 are preferably substantially identical to each other. As an example, each of regions 236, 237, and 238 can be approximately 0.1 to 5.0 micrometers thick, approximately 10 to 100 micrometers wide, and approximately 100 to 500 micrometers long.

Next, an electrically insulative material is disposed over electrically conductive regions 236, 237, 238, and 239. This electrically insulative material is also referred to as a sacrificial layer. The electrically insulative material is comprised of a material that is different from at least the top portion of layer 220. In the preferred embodiment, the electrically insulative material consists of a solid dielectric material. The electrically insulative material can be comprised of a plurality of layers. The thickness of the electrically insulative material defines the distance between the top and bottom capacitive electrodes of capacitors 260, 270, 280, and 290. As an example, the electrically insulative material can be approximately 0.1 to 5.0 micrometers thick. The electrically insulative material is patterned, preferably simultaneously, into portions 246, 247, 248, and 249.

Then, electrically conductive regions 256, 257, 258, and 259 are formed over electrically conductive regions 236, 237, 238, and 239, respectively, and also over portions 246, 247, 248, and 249, respectively, of the electrically insulative material. Regions 256, 257, 258, and 259 can serve as top capacitive electrodes for capacitors 260, 270, 280, and 290, respectively. As an example of a simultaneous formation of regions 256, 257, 258, and 259, an electrically conductive layer can be deposited over the electrically insulative material and can be patterned into regions 256, 257, 258, and 259. The electrically conductive layer can be comprised of, for example, doped polycrystalline silicon. The thickness of the electrically conductive layer can be large enough to prevent regions 257, 258, and 259 from being sensitive to pressure after the removal or partial removal of portions 247, 248, and 249 of the electrically insulative material.

Subsequently, a portion of portion 247 of the electrically insulative material is removed from between regions 237 and 257 in capacitor 270. The removal of this portion of portion 247 forms a gap between regions 237 and 257. However, this removal process leaves a different portion of portion 247 between regions 237 and 257. As an example, a liquid or vapor etchant can be used to remove the portion of portion 247. The liquid or vapor etchant can be comprised of a hydrofluoric acid solution when the electrically insulative material is comprised of silicon dioxide.

Portion 248 of the electrically insulative material is also removed from between regions 238 and 258 in capacitor 280. The removal of portion 248 forms a gap between regions 238 and 258. The removal of portion 248 from capacitor 280 preferably occurs simultaneously with the removal of the portion of portion 247 from capacitor 270.

Portion 249 of the electrically insulative material is also removed from between regions 239 and 259 in capacitor 290. The removal of portion 249 forms a gap between regions 239 and 259. The removal of portion 249 from capacitor 290 preferably occurs simultaneously with the removal of portion 248 from capacitor 280 and the removal of the portion of portion of 247 from capacitor 270.

The removal of the portion of portion 247, portion 248, and portion 249 of the electrically insulative material begins at portions 241 (FIG. 2) of the electrically insulative material, which extend from underneath or which protrude beyond electrically conductive regions 257, 258, or 259. After the liquid or vapor etchant removes portions 241, a plurality of openings or etch ports are formed underneath regions 258 and 259, and a single opening or etch port is formed underneath region 257. These openings or ports provide a pathway for entry of the etchant and thus expose additional portions of the electrically insulative material underneath regions 257, 258, and 259 to the liquid or vapor etchant. Accordingly, these exposed portions of the electrically insulative material can also be removed by the liquid or vapor etchant. Not all of portion 247 of the electrically insulative material is removed due to the single opening or etch port and the preferred long and narrow configuration of capacitor 270. Portion 246 of the electrically insulative material is protected on all sides from the liquid or vapor etchant by electrically conductive region 256. Therefore, none of portion 246 of the electrically insulative material is removed from capacitor 260 due to the lack of openings or etch ports in capacitor 260.

Figure 4:
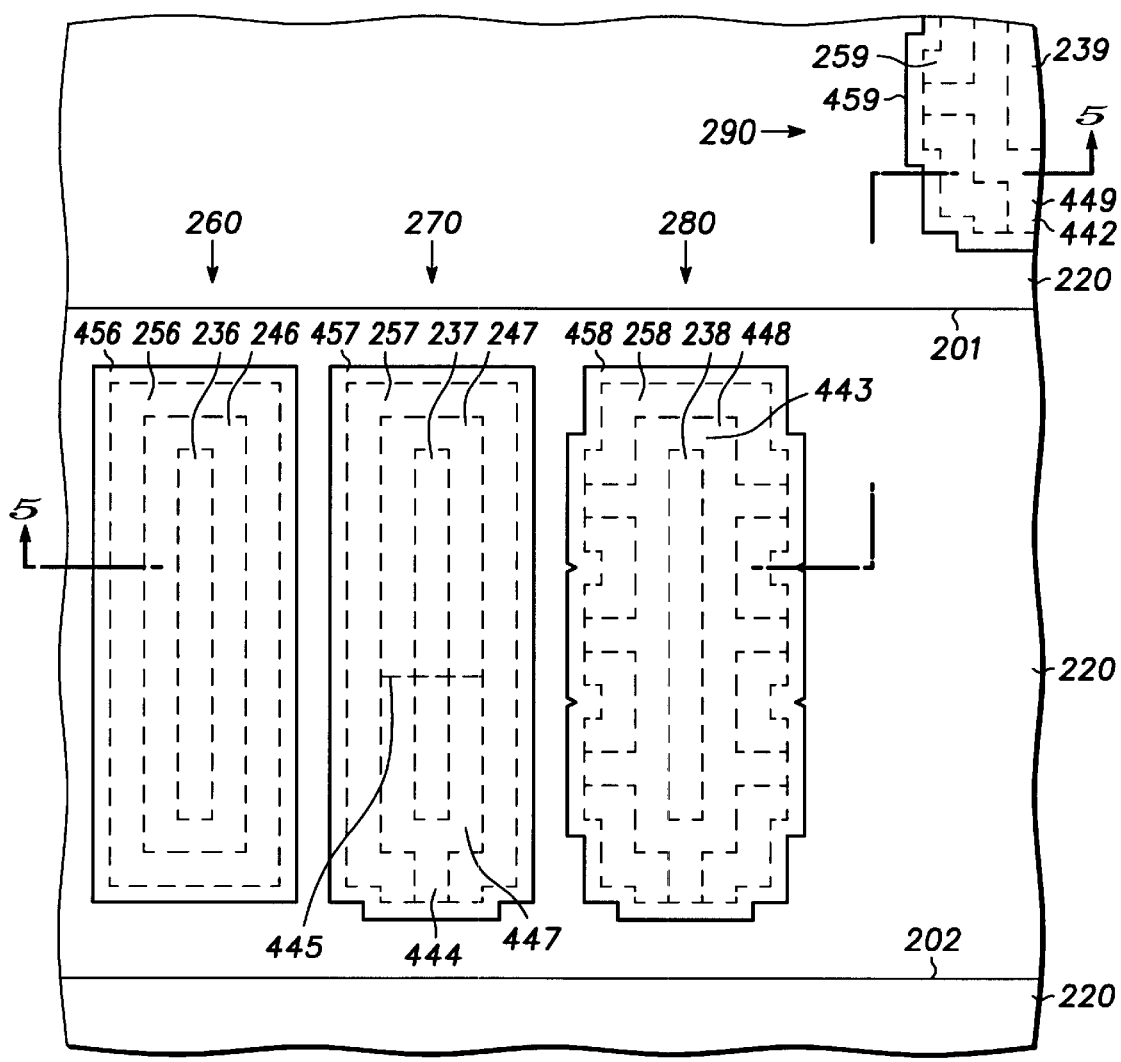
FIG. 4 illustrates a top view of the portion of the electronic component after subsequent steps in the method of FIG. 1 in accordance with an embodiment of the invention.
Figure 5:
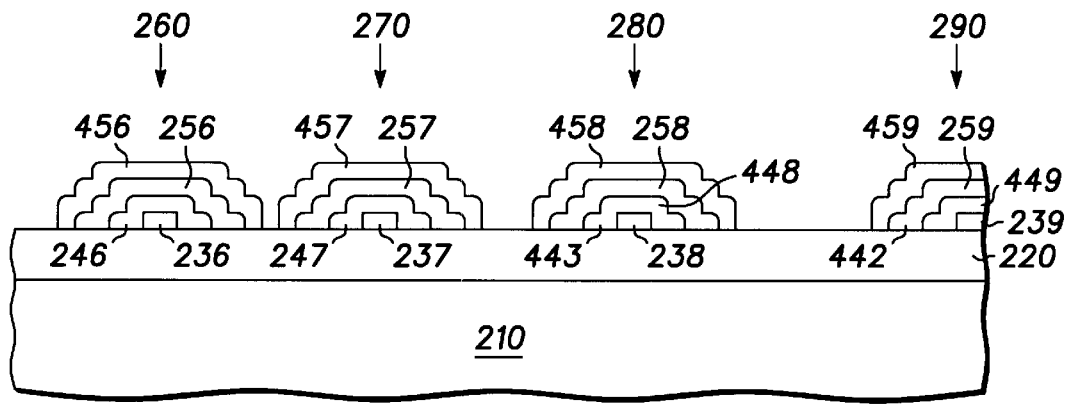
FIG. 5 illustrates a cross-sectional view of the portion of the electronic component of FIG. 4 taken along a section line 5—5.

FIG. 4 illustrates a top view of the portion of electronic component 200 after subsequent steps in method 100 of FIG. 1. FIG. 5 illustrates a cross-sectional view of the portion of electronic component 200 taken along a section line 5—5 in FIG. 4. FIG. 4 illustrates the remaining portion of portion 247 of the electrically insulative material between regions 237 and 257 in capacitor 270. FIG. 4 also illustrates a gap 444 between regions 237 and 257 located at the removed portion of portion 247 of the electrically insulative material. FIG. 4 further illustrates a gap 443 between regions 238 and 258 in capacitor 280. Gap 443 represents the complete removal of portion 248 (FIGS. 2 and 3) of the electrically insulative material from between regions 238 and 258. FIG. 4 additionally illustrates a gap 442 between regions 239 and 259 in capacitor 290. Gap 442 represents the complete removal of portion 249 (FIGS. 2 and 3) of the electrically insulative material from between regions 239 and 259. As indicated earlier, gaps 442, 443, and 444 are preferably formed simultaneously with each other. The area of gap 443 in capacitor 280 is larger than the area of gap 444 in capacitor 270, and capacitor 260 is devoid of a gap because portion 246 of the electrically insulative material is kept between regions 236 and 256.

As illustrated in FIG. 4, capacitor 280 has a first number of openings or etch ports coupled to gap 443. The openings or etch ports are preferably absent over region 238 so that openings are not formed in region 258 because the presence of openings in region 258 affects the capacitance between regions 258 and 238. In this preferred embodiment, capacitors 260, 270, and 280 have substantially identical capacitive areas or geometries, and their respective capacitances are preferably affected only by the composition of the dielectric material between the top and bottom capacitive electrodes of capacitors 260, 270, and 280.

The openings or etch ports of capacitor 280 are preferably located along the sides of region 258 and also along a narrow end of region 258. Most of the openings or etch ports of capacitor 280 are located along the sides of region 258 to allow removal of the dielectric material between electrically conductive regions 238 and 258 in a relatively short period of time. Capacitor 270 has a second number of openings or etch ports less than the first number of openings or etch ports of capacitor 280. The openings or etch ports of capacitor 270 are coupled to gap 444 and are also preferably absent over region 237. In the preferred embodiment, capacitor 270 has a single opening or etch port located at a narrow end of capacitor 270. In the preferred embodiment, capacitor 260 is devoid of openings or etch ports.

A third amount of a different electrically insulative material can be disposed in gap 444 after removing the portion of portion 247 of the electrically insulative material from between regions 237 and 257 in capacitor 270. In the preferred embodiment, the third amount of this different electrically insulative material fills gap 444. If a liquid etchant is used to remove the portion of portion 247 of the electrically insulative material to form gap 444, then the different electrically insulative material can be disposed in gap 444 after removing the portion of portion 247. If a vapor etchant is used to remove the portion of portion 247 of the electrically insulative material to form gap 444, then the different electrically insulative material can be disposed in gap 444 while simultaneously removing the portion of portion 247.

Additionally, a fourth amount of the different electrically insulative material is disposed in gap 443 after removing the electrically insulative material from between regions 238 and 258 in capacitor 280. This fourth amount of the different electrically insulative material preferably fills gap 443. If a liquid etchant is used to remove portion 248 of the electrically insulative material to form gap 443, then the different electrically insulative material can be disposed in gap 443 after removing portion 248. If a vapor etchant is used to remove portion 248 of the electrically insulative material to form gap 443, then the different electrically insulative material can be disposed in gap 443 while simultaneously removing portion 248.

Moreover, a fifth amount of the different electrically insulative material is disposed in gap 442 after removing the electrically insulative material from between regions 239 and 259 in capacitor 290. In the preferred embodiment, the fifth amount of the different electrically insulative material preferably fills gap 442. If a liquid etchant is used to remove portion 249 of the electrically insulative material to form gap 442, then the different electrically insulative material can be disposed in gap 442 after removing portion 249. If a vapor etchant is used to remove portion 249 of the electrically insulative material to form gap 442, then the different electrically insulative material can be disposed in gap 442 while simultaneously removing portion 249.

In the preferred embodiment, gaps 442, 443, and 444 are preferably simultaneously disposed or filled with the different amounts of the different electrically insulative material. Further in the preferred embodiment, the different electrically insulative material is selected from the group consisting of a liquid and a gas. As an example, the gas can include low pressure compositions commonly referred to as a vacuum. The different electrically insulative material is preferably kept absent from between regions 236 and 256 of capacitor 260.

Next, another electrically insulative material is optionally disposed over regions 256, 257, 258, and 259. This optional electrically insulative material seals the openings or etch ports in capacitor 270, 280, and 290 in order to seal portions 447, 448, and 449 of the liquid or gaseous electrically insulative material in gaps 444, 443, and 442. As an example, the liquid or gaseous electrically insulated material in gaps 444, 443, and 442 of capacitors 270, 280, and 290, respectively, can be air. When the first electrically insulative material is comprised of PSG and the second electrically insulative material is comprised of air, the measured capacitance value of capacitor 290 will be approximately four time smaller than the measured capacitance value of capacitor 270. When the optional sealing step is used, the optional electrically insulative layer can be patterned into portions 456, 457, 458, and 459, as illustrated in FIGS. 4 and 5. Portions 456, 457, 458, and 459 can be kept continuous over electrically conductive regions 256, 257, 258, and 259, respectively, to keep the top electrode of capacitors 260, 270, 280, and 290, respectively, rigid and substantially insensitive to pressure. In an alternative embodiment, portions 456, 457, 458, and 459 can be comprised of an electrically conductive material.

Each of capacitors 260, 270, and 280 has different amounts of two different electrically insulative materials between their respective top and bottom capacitive electrodes. Accordingly, the electrical testing of capacitors 260, 270, and 280 will measure different capacitances for each capacitor, despite the capacitive sizes for each of capacitors 260, 270, and 280 being preferably substantially equal to each other and despite the capacitive geometries for each of capacitors 260, 270, and 280 being preferably substantially identical to each other. The capacitive measurements can be used to estimate the amount of portion 247 of the first electrically insulative material.

Figure 6:
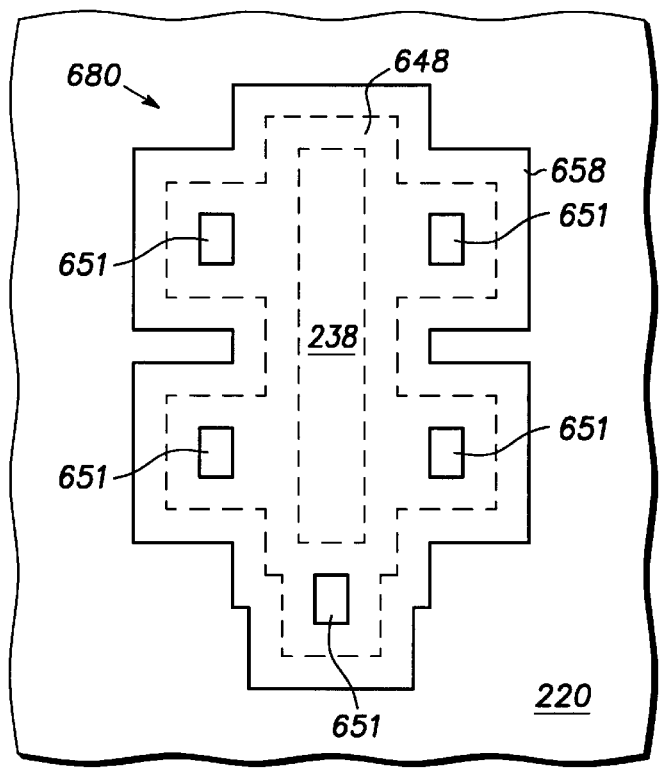
FIG. 6 illustrates a top view of a portion of a different electronic component in accordance with an embodiment of the invention.

FIG. 6 illustrates a top view of a portion of an electronic component 600 having a test structure 680, which is a different embodiment of capacitor 280 in FIG. 2. Structure 680 comprises electrically conductive region 238, a portion 648 of an electrically insulative material overlying region 238, and an electrically conductive region 658 overlying portion 648. Portion 648 and region 658 in structure 680 are similar to portion 248 and region 258 in capacitor 280 of FIG. 2. Region 658 in structure 680 includes openings, etch ports, or holes 651 overlying and exposing portions of portion 648 of the electrically insulative material. In this embodiment, portion 648 of the electrically insulative material does not extend beyond region 658. Holes 651 are used to remove portion 648 of the first electrically insulative material. Holes 651 can be sealed in a manner similar to that described earlier for the openings or etch ports of capacitor 280 in FIGS. 4 and 5. One skilled in the art will understand that if capacitor 280 in FIG. 2 were replaced with test structure 680 in FIG. 6, then capacitors 270 and 290 in FIG. 2 would also be altered in a manner similar to that described for capacitor 280.

Figure 7:
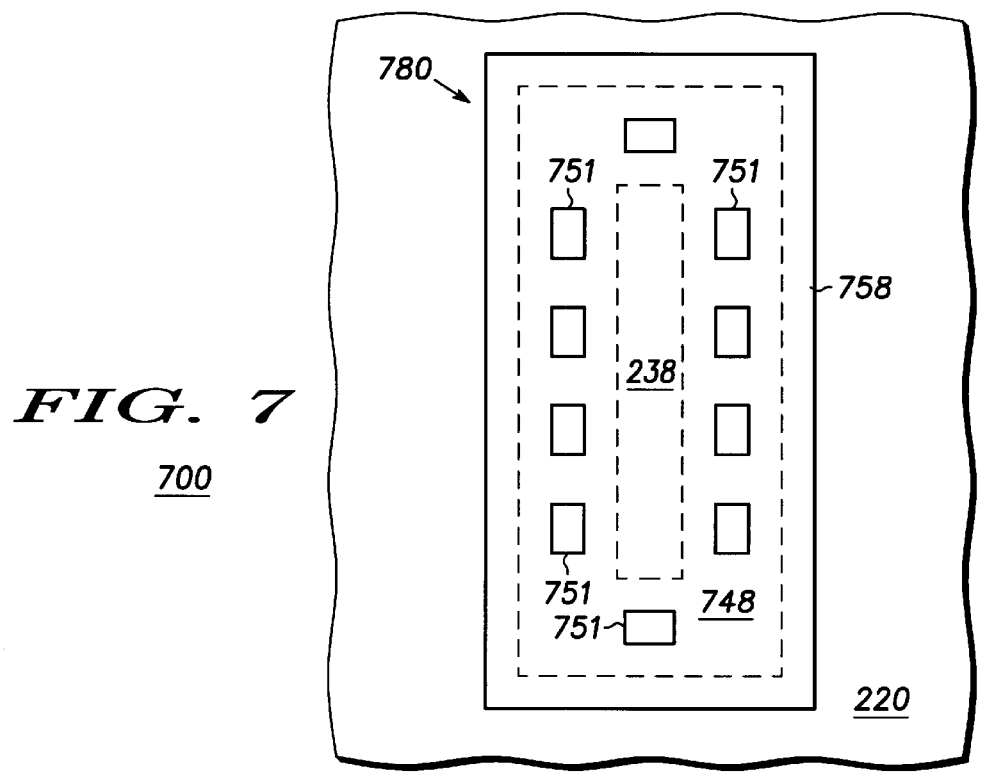
FIG. 7 illustrates a top view of a portion of another electronic component in accordance with an embodiment of the invention.

FIG. 7 illustrates a top view of a portion of an electronic component 700 having a test structure 780, which is another embodiment of capacitor 280 in FIG. 2. Structure 780 comprises electrically conductive region 238, a portion 748 of an electrically insulative material overlying region 238, and an electrically conductive region 758 overlying portion 748. Portion 748 and region 758 in structure 780 are similar to portion 248 and region 258 in capacitor 280 of FIG. 2. Region 758 in structure 780 includes openings, etch ports, or holes 751 overlying and exposing portions of portion 748 of the electrically insulative material. In this embodiment, portion 748 of the electrically insulative material does not extend beyond region 758. Holes 751 are used to remove portion 748 of the first electrically insulative material. Holes 751 can be sealed in a manner similar to that described earlier for the openings or etch ports of capacitor 280 in FIGS. 4 and 5. One skilled in the art will understand that if capacitor 280 in FIG. 2 were replaced with test structure 780 in FIG. 7, then capacitors 270 and 290 in FIG. 2 would also be altered in a manner similar to that described for capacitor 280.

Therefore, an improved electronic component and method of manufacture is provided to overcome the disadvantages of the prior art. The electronic component and method of manufacturing have test structures capable of characterizing an etch process for a sacrificial layer. The measurement or evaluation of the test structures can be easily automated such that the characterization of the etch process for the sacrificial layer is compatible with existing Statistical Process Control (SPC) methods. The substantially identical test structures or capacitors allow compensation for different thicknesses and different dielectric constants for the electrically insulative layers from substrate to substrate. Additionally, when PSG is used for the sacrificial layer, the test structures can be used to calculate the dielectric constant of the sacrificial layer and to estimate the phosphorous content in the sacrificial layer.

Although the invention has been described with reference to specific embodiments, it will be understood by those skilled in the art that various changes may be made without departing from the spirit or scope of the invention. For instance, the numerous details set forth herein such as, for example, the material compositions and the capacitor configurations are provided to facilitate the understanding of the invention and are not provided to limit the scope of the invention. Furthermore, the capacitors can be differential capacitors. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing an electronic component comprising:
   providing a substrate;
   forming a first capacitor supported by the substrate and comprised of a first electrically conductive region, a second electrically conductive region separated from the first electrically conductive region to form a first capacitive area having a size, and a first electrically insulative material located between the first and second electrically conductive regions;
   forming a second capacitor supported by the substrate and comprised of a third electrically conductive region, a fourth electrically conductive region separated from the third electrically conductive region to form a second capacitive area having the size, the first electrically insulative material located between the third and fourth electrically conductive regions, and a second electrically insulative material located between the third and fourth electrically conductive regions;
   forming a third capacitor supported by the substrate and comprised of a fifth electrically conductive region, a sixth electrically conductive region separated from the fifth electrically conductive region to form a third capacitive area having the size, and the second electrically insulative material located between the fifth and sixth electrically conductive regions;
   electrically testing the first capacitor to measure a first capacitance value;
   electrically testing the second capacitor to measure a second capacitance value; and
   electrically testing the third capacitor to measure a third capacitance value.

2. The method of claim 1 wherein:
   forming the first capacitor further comprises:
      providing a first amount of the first electrically insulative material between the first and second electrically conductive regions;
   forming the second capacitor further comprises:
      providing a second amount of the first electrically insulative material between the third and fourth electrically conductive regions, wherein the second amount of the first electrically insulative material is less than the first amount of the first electrically insulative material; and
      providing a third amount of the second electrically insulative material between the third and fourth electrically conductive regions; and
   forming the third capacitor further comprises:
      providing a fourth amount of the second electrically insulative material between the fifth and sixth electrically conductive regions, wherein the fourth amount of the second electrically insulative material is greater than the third amount of the second electrically insulative material.

3. The method of claim 1 wherein:
   forming the second capacitor further comprises:
      providing the first electrically insulative material located between first portions of the third and fourth electrically conductive regions; and
      providing the second electrically insulative material located between second portions of the third and fourth electrically conductive regions different from the first portions of the third and fourth electrically conductive regions.

4. The method of claim 1 wherein:
   forming the first capacitor further comprises:
      keeping the second electrically insulative material absent from between the first and second electrically conductive regions; and
   forming the third capacitor further comprises:
      providing the first electrically insulative material between the fifth and sixth electrically conductive regions;
      removing the first electrically insulative material from between the fifth and sixth electrically conductive regions; and
      disposing the second electrically insulative material between the fifth and sixth electrically conductive regions after removing the first electrically insulative material.

5. The method of claim 1 wherein:
   forming the first capacitor further comprises:
      keeping the second electrically insulative material absent from between the first and second electrically conductive regions; and
   forming the third capacitor further comprises:
      providing the first electrically insulative material between the fifth and sixth electrically conductive regions;
      removing the first electrically insulative material from between the fifth and sixth electrically conductive regions; and
      disposing the second electrically insulative material between the fifth and sixth electrically conductive regions while simultaneously removing the first electrically insulative material.

6. The method of claim 1 wherein:
   the first, third, and fifth electrically conductive regions are substantially identical to each other.

7. The method of claim 1 wherein:
   forming the first capacitor further comprises:
      providing a distance between the first and second electrically conductive regions; forming the second capacitor further comprises:
      providing the distance between the third and fourth electrically conductive regions; and
   forming the third capacitor further comprises:
      providing the distance between the fifth and sixth electrically conductive regions.

8. The method of claim 1 wherein:
   electrically testing the second capacitor further comprises:
      measuring the second capacitance value to be less than the first capacitance value; and
   electrically testing the third capacitor further comprises:
      measuring the third capacitance value to be less than the second capacitance value.

9. The method of claim 1 wherein:
   forming the third capacitor further comprises simultaneously forming the first capacitor, the second capacitor, and the third capacitor.

10. The method of claim 1 wherein:
    forming the first capacitor, forming the second capacitor, and forming the third capacitor further comprise:
       simultaneously forming the first, third, and fifth electrically conductive regions;
       disposing the first electrically insulative material over the first, third, and fifth electrically conductive regions;
       simultaneously forming the second, fourth, and sixth electrically conductive regions over the first electrically insulative material;
       removing a first portion of the first electrically insulative material from between the third and fourth electrically conductive regions;

removing a second portion of the first electrically insulative material from between the fifth and sixth electrically conductive regions;

disposing the second electrically insulative material between the third and fourth electrically conductive regions after removing the first portion of the first electrically insulative material; and disposing the second electrically insulative material between the fifth and sixth electrically conductive regions after removing the second portion of the first electrically insulative material.

11. The method of claim 1 wherein:

forming the first capacitor, forming the second capacitor, and forming the third capacitor further comprise:

simultaneously forming the first, third, and fifth electrically conductive regions;

disposing the first electrically insulative material over the first, third, and fifth electrically conductive regions;

simultaneously forming the second, fourth, and sixth electrically conductive regions over the first electrically insulative material;

removing a first portion of the first electrically insulative material from between the third and fourth electrically conductive regions;

removing a second portion of the first electrically insulative material from between the fifth and sixth electrically conductive regions;

disposing the second electrically insulative material between the third and fourth electrically conductive regions while simultaneously removing the first portion of the first electrically insulative material; and disposing the second electrically insulative material between the fifth and sixth electrically conductive regions while simultaneously removing the second portion of the first electrically insulative material.

12. The method of claim 11 wherein:

removing the second portion of the first electrically insulative material occurs while simultaneously removing the first portion of the first electrically insulative material; and disposing the second electrically insulative material between the third and fourth electrically conductive regions occurs while simultaneously disposing the second electrically insulative material between the fifth and sixth electrically conductive regions.

13. The method of claim 1 wherein:

forming the first capacitor, forming the second capacitor, and forming the third capacitor further comprise:

disposing a layer over the second, fourth, and sixth electrically conductive regions to seal the second electrically insulative material between the third and fourth electrically conductive regions between the fifth and sixth electrically conductive regions.

14. The method of claim 13 wherein:

forming the first capacitor, forming the second capacitor, and forming the third capacitor further comprise:

keeping portions of the layer located over the second, fourth, and sixth electrically conductive regions continuous over the second, fourth, and sixth electrically conductive regions.

15. The method of claim 1 wherein:

forming the first capacitor, forming the second capacitor, and forming the third capacitor further comprise:

providing the first electrically insulative material consisting of a solid dielectric material; and providing the second electrically insulative material from the group consisting of a liquid and a gas.

16. The method of claim 1 wherein:

forming the first capacitor further comprises:

keeping the first electrically insulative material between the first and second electrically conductive regions;

forming the second capacitor further comprises:

forming a first gap between the third and fourth electrically conductive regions; and filling the first gap with the second electrically insulative material;

forming the third capacitor further comprises:

forming a second gap between the fifth and sixth electrically conductive regions; and filling the second gap with the second electrically insulative material.

17. The method of claim 16 wherein:

forming the second gap further comprises:

forming the second gap simultaneously with the first gap; and forming the second gap larger than the first gap.

18. A method of manufacturing an electronic component comprising:

providing a semiconductor substrate;

forming a first capacitor supported by the semiconductor substrate and comprised of a first electrically conductive region, a second electrically conductive region separated from the first electrically conductive region by a distance and overlying the first electrically conductive region to form a first capacitive area having a size, and a first amount of a first electrically insulative material located between the first and second electrically conductive regions;

forming a second capacitor supported by the semiconductor substrate and comprised of a third electrically conductive region, a fourth electrically conductive region separated from the third electrically conductive region by the distance and overlying the third electrically conductive region to form a second capacitive area having the size, a second amount of the first electrically insulative material located between the third and fourth electrically conductive regions, and a third amount of a second electrically insulative material located between the third and fourth electrically conductive regions, wherein the second amount of the first electrically insulative material is less than the first amount of the first electrically insulative material;

forming a third capacitor supported by the semiconductor substrate and comprised of a fifth electrically conductive region, a sixth electrically conductive region separated from the fifth electrically conductive region by the distance and overlying the fifth electrically conductive region to form a third capacitive area having the size, and a fourth amount of the second electrically insulative material located between the fifth and sixth electrically conductive regions, wherein the fourth amount of the second electrically insulative material is greater than the third amount of the second electrically insulative material;

forming the electronic component supported by the semiconductor substrate, the electronic component having a fourth capacitor;

electrically testing the first capacitor to measure a first capacitance value;

electrically testing the second capacitor to measure a second capacitance value less than the first capacitance value; and electrically testing the third capacitor to measure a third capacitance value less than the second capacitance value.

19. The method of claim 18 wherein:

forming the electronic component further comprises simultaneously forming the electronic component, the first capacitor, the second capacitor, and the third capacitor.

20. The method of claim 19 wherein:

forming the first capacitor, forming the second capacitor, and forming the third capacitor further comprise:

simultaneously forming the first, third, and fifth electrically conductive regions;

disposing the first electrically insulative material over the first, third, and fifth electrically conductive regions;

simultaneously forming the second, fourth, and sixth electrically conductive regions over the first, third, and fifth electrically conductive regions, respectively, and over the first electrically insulative material;

removing a first portion of the first electrically insulative material from between the third and fourth electrically conductive regions to form a first gap between the third and fourth electrically conductive regions and to leave the second amount of the first electrically insulative material between the third and fourth electrically conductive regions;

removing a second portion of the first electrically insulative material from between the fifth and sixth electrically conductive regions to form a second gap between the fifth and sixth electrically conductive regions and to remove the first electrically insulative material from between the fifth and sixth electrically conductive regions;

disposing the third amount of the second electrically insulative material in the first gap; and disposing the fourth amount of the second electrically insulative material in the second gap.

21. The method of claim 20 wherein:

removing the second portion of the first electrically insulative material occurs while simultaneously removing the first portion of the first electrically insulative material;

removing the second portion of the first electrically insulative material further comprises forming the second gap larger than the first gap; and disposing the third amount of the second electrically insulative material occurs while simultaneously disposing the fourth amount of the second electrically insulative material.

22. The method of claim 21 wherein:

forming the first capacitor, forming the second capacitor, and forming the third capacitor further comprise:

disposing a third electrically insulative material over the second, fourth, and sixth electrically conductive regions to seal the third amount of the second electrically insulative material between the third and fourth electrically conductive regions and to seal the fourth amount of the second electrically insulative material between the fifth and sixth electrically conductive regions.

23. The method of claim 22 wherein:

forming the first capacitor, forming the second capacitor, and forming the third capacitor further comprise:

keeping portions of the third electrically insulative material located over the second, fourth, and sixth electrically conductive regions continuous over the second, fourth, and sixth electrically conductive regions.

24. The method of claim 23 wherein:

forming the first capacitor, forming the second capacitor, and forming the third capacitor further comprise:

providing the first electrically insulative material consisting of a solid dielectric material; and providing the second electrically insulative material from the group consisting of a liquid and a gas.

25. A method of manufacturing an electronic component comprising:

providing a substrate;

forming a first capacitor supported by the substrate and comprised of a first electrically conductive region, a second electrically conductive region separated from the first electrically conductive region to form a first capacitive area having a size, and a first electrically insulative material located between the first and second electrically conductive regions, the first capacitor devoid of a port;

forming a second capacitor supported by the substrate and comprised of a third electrically conductive region, a fourth electrically conductive region separated from the third electrically conductive region to form a second capacitive area having the size, the first electrically insulative material located between the third and fourth electrically conductive regions, and a second electrically insulative material located between the third and fourth electrically conductive regions, the second capacitor having at least one port;

electrically testing the first capacitor to measure a first capacitance value; and electrically testing the second capacitor to measure a second capacitance value.

26. A method of manufacturing an electronic component comprising:

providing a substrate;

forming a first capacitor supported by the substrate and comprised of a first electrically conductive region, a second electrically conductive region separated from the first electrically conductive region to form a first capacitive area having a size, a first electrically insulative material located between the first and second electrically conductive regions, and a second electrically insulative material located between the first and second electrically conductive regions, the second capacitor having a first number of ports;

forming a second capacitor supported by the substrate and comprised of a third electrically conductive region, a fourth electrically conductive region separated from the third electrically conductive region to form a second capacitive area having the size, and the second electrically insulative material located between the third and fourth electrically conductive regions, the second capacitor having a second number of ports greater than the first number of ports;

electrically testing the second capacitor to measure a second capacitance value; and electrically testing the third capacitor to measure a third capacitance value.

* * * * *